US008847240B2

United States Patent
Chung et al.

(10) Patent No.: US 8,847,240 B2
(45) Date of Patent: Sep. 30, 2014

(54) OPTOELECTRONIC DEVICES

(75) Inventors: Dae-young Chung, Yongin-si (KR);
Kyung-sang Cho, Gwacheon-si (KR);
Tae-ho Kim, Suwon-si (KR);
Byoung-lyong Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 13/408,279

(22) Filed: Feb. 29, 2012

(65) Prior Publication Data
US 2013/0015424 A1  Jan. 17, 2013

(30) Foreign Application Priority Data

Jul. 14, 2011 (KR) .................. 10-2011-0070034

(51) Int. Cl.
*H01L 29/06* (2006.01)
*H01L 27/15* (2006.01)
*H01L 51/52* (2006.01)
*H01L 51/00* (2006.01)

(52) U.S. Cl.
CPC ............ *H01L 51/52* (2013.01); *H01L 51/0094* (2013.01)
USPC ................. 257/79; 257/431; 257/9

(58) Field of Classification Search
CPC ..... H01L 51/52; H01L 51/0094; H01L 33/02; H01L 3/02; H01L 33/04; H01L 31/02
USPC ................. 257/79–104, 9, E33.045, E31.054
See application file for complete search history.

(56) References Cited

U.S. PATENT DOCUMENTS

| 7,772,487 B1* | 8/2010 | Robinson ................. 136/263 |
| 2005/0098204 A1* | 5/2005 | Roscheisen et al. ......... 136/263 |
| 2009/0188558 A1* | 7/2009 | Jen et al. ................. 136/256 |

FOREIGN PATENT DOCUMENTS

| JP | 2010-103534 A | 5/2010 |
| JP | 2010-209141 A | 9/2010 |
| KR | 10-2004-0106923 A | 12/2004 |
| KR | 10-2011-0023164 A | 3/2011 |
| KR | 10-2012-0015945 A | 2/2012 |

OTHER PUBLICATIONS

Chen et al. ("Interface investigation and engineering—achieving high performance polymer photovoltaic devices" J. Mater. Chem., 2010,20, 2575-2598.*

Chen et al. ("Submicron-scale manipulation of phase separation in organic solar cells"; Applied Physics Letters 92, 023307 Published 17, Jan. 2008).*

* cited by examiner

*Primary Examiner* — Asok K Sarkar
*Assistant Examiner* — Dmitriy Yemelyanov
(74) *Attorney, Agent, or Firm* — Sughrue Mion, PLLC

(57) ABSTRACT

An optoelectronic device is provided including an element that forms a dipole moment between an active layer and a charge transport layer. The optoelectronic device may include an active layer between a first electrode and a second electrode, a first charge transport layer between the first electrode and the active layer, and a dipole layer between the active layer and the first charge transport layer. A second charge transport layer may be further provided between the second electrode and the active layer. The second dipole layer may be further provided between the second charge transport layer and the active layer.

16 Claims, 8 Drawing Sheets

< BEFORE FORMING SAM >

< AFTER FORMING SAM >

OPTOELECTRONIC DEVICES

CROSS-REFERENCE TO RELATED APPLICATION

This application claims priority from Korean Patent Application No. 10-2011-0070034, filed on Jul. 14, 2011, in the Korean Intellectual Property Office, the disclosure of which is incorporated herein in its entirety by reference.

BACKGROUND

1. Field

The present disclosure relates to optoelectronic devices.

2. Description of the Related Art

Optoelectronic devices collectively refers to devices that convert electrical energy into optical energy, and devices that convert optical energy into electrical energy.

Devices that convert electrical energy into optical energy include a light-emitting device such as a light-emitting diode (LED), a laser diode (LD), and the like. When an electrical signal is input to a light-emitting device, electrons and holes are combined in a light-emitting layer, so that light is generated.

Devices that convert optical energy into electrical energy include a photovoltaic device such as a solar cell, a photodiode, and the like. When light is irradiated to a photovoltaic device, electrons and holes are separated in a photoactive layer, so that electrical energy is generated.

Recently, optoelectronic devices have drawn attention as a next generation light source and an alternative energy source, and related research and development has been actively conducted. In particular, research into increasing an energy conversion efficiency of optoelectronic devices has been conducted.

SUMMARY

One or more exemplary embodiments provide optoelectronic devices whose energy conversion efficiency is increased.

One or more exemplary embodiments provide optoelectronic devices whose charge (hole/electron) injection or extraction efficiency is increased.

Additional aspects will be set forth in part in the description which follows and, in part, will be apparent from the description, or may be learned by practice of the presented exemplary embodiments.

According to an aspect of an exemplary embodiment, an optoelectronic device includes a first electrode; a second electrode separate from the first electrode; an active layer between the first electrode and the second electrode; a first charge transport layer between the first electrode and the active layer; and a dipole layer which forms a dipole moment between the active layer and the first charge transport layer.

The first charge transport layer may transport a first charge, and a potential barrier with respect to the first charge between the active layer and the first charge transport layer may be decreased due to the presence of the dipole layer The dipole layer may include an amphiphilic material.

The amphiphilic material may include a polar portion and a non-polar portion.

The amphiphilic material may include a hydrophilic functional group and a hydrophobic functional group.

The dipole layer may include a self-assembled monolayer (SAM).

The dipole layer may include a surfactant.

The dipole layer may include an inorganic material.

A thickness of the dipole layer may be equal to or less than about 10 nm.

The first charge transport layer may be a hole transport layer (HTL).

The HTL may include at least one of a p-type inorganic semiconductor and a p-type organic semiconductor, the p-type inorganic semiconductor may be oxide or non-oxide, and the p-type organic semiconductor may be a monomer or a polymer.

Ionization potential of the HTL may be increased due to the presence of the dipole layer.

The active layer may include a quantum dot.

The active layer may include at least one of an inorganic material and an organic material.

The optoelectronic device may further include a second charge transport layer between the second electrode and the active layer.

The second charge transport layer may be an electron transport layer (ETL).

The ETL may include at least one of an n-type inorganic semiconductor and an n-type organic semiconductor, the n-type inorganic semiconductor may be oxide or non-oxide, and the n-type organic semiconductor may be a monomer or a polymer.

The optoelectronic device may further include a second dipole layer that forms a dipole moment between the active layer and the second charge transport layer.

The second charge transport layer may transport a second charge, and a potential barrier with respect to the second charge between the active layer and the second charge transport layer may be decreased due to the presence of the second dipole layer.

The active layer may be a light-emitting layer, and the optoelectronic device may be a light-emitting device.

The active layer may be a photoactive layer, and the optoelectronic device may be a photovoltaic device.

According to an aspect of another exemplary embodiment, an optoelectronic device includes an anode and a cathode that are separate from each other; an active layer between the anode and the cathode; a hole transport layer (HTL) between the anode and the active layer; an electron transport layer (ETL) between the cathode and the actively layer; and a dipole layer between the active layer and the HTL and/or between the active layer and the ETL.

If a first dipole layer is disposed between the active layer and the HTL, a potential barrier with respect to holes between the active layer and the HTL may be decreased due to the first dipole layer.

If a second dipole layer is disposed between the active layer and the ETL, a potential barrier with respect to electrons between the active layer and the ETL may be decreased due to the second dipole layer.

The dipole layer may include an amphiphilic material.

The dipole layer may include a self-assembled monolayer (SAM) or a surfactant.

The active layer may include a quantum dot.

At least one of the HTL and the ETL may include oxide.

BRIEF DESCRIPTION OF THE DRAWINGS

These and/or other aspects and advantages will become apparent and more readily appreciated from the following description of exemplary embodiments, taken in conjunction with the accompanying drawings in which.

DETAILED DESCRIPTION

Figure 1:
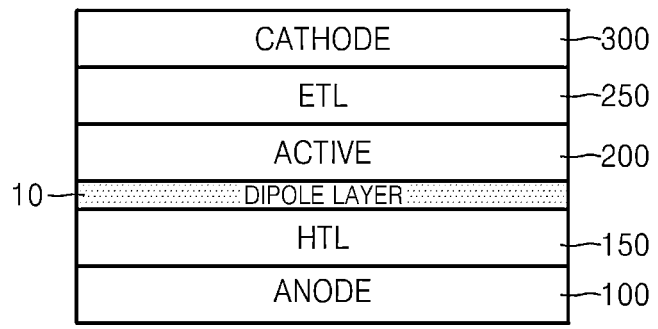
FIG. 1 is a cross-sectional view illustrating an optoelectronic device according to an exemplary embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of the exemplary embodiments. As such, variations from the shapes of the illustrations as a result, for example, of manufacturing techniques and/or tolerances, are to be expected. Thus, the exemplary embodiments should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings. In the drawings, the thicknesses of layers and regions are exaggerated for clarity. Like reference numerals denote like elements throughout the specification.

FIG. 1 is a cross-sectional view illustrating an optoelectronic device according to an exemplary embodiment.

Referring to FIG. 1, the optoelectronic device may include an anode 100 and a cathode 300 that is separated from the anode 100. The anode 100 and the cathode 300 may be referred to as a first electrode and a second electrode, respectively. The anode 100 may be formed of indium tin oxide (ITO), Al, Ag, Au, carbon nanotube (CNT), graphene, or the like. The cathode 300 may be formed of Al, Mg, ITO, Au, Ag, CNT, graphene, Ca, Ba, or the like. However, materials for forming the anode 100 and the cathode 300 are not limited thereto and thus may include various types of metal, conductive oxide, and the like.

An active layer 200 may be disposed between the anode 100 and the cathode 300. The active layer 200 may be a light-emitting layer. In this case, the optoelectronic device according to the present embodiment may be a light-emitting device. When an electrical signal is applied between the anode 100 and the cathode 300, electrons and holes are injected into the active layer 200 (i.e., the light-emitting layer) and then are combined, so that light may be generated. A wavelength of the light may vary according to an energy band gap of the active layer 200 (i.e., the light-emitting layer).

The active layer 200 may be a photoactive layer that is electrically activated by light. In this case, the optoelectronic device according to the present embodiment may be a photovoltaic device. When light is irradiated to the active layer 200 (i.e., the photoactive layer), an exciton, that is, a bound state of an electron and hole (i.e., electron-hole pair), may be generated in the active layer 200 (i.e., the photoactive layer), and then the exciton is separated into an electron and a hole, so that current may flow. The electron may move toward the anode 100, and the hole may move toward the cathode 300.

The active layer 200 may include an organic light-emitting material and/or an inorganic light-emitting material, or may include an organic photoactive material and/or an inorganic photoactive material. Each of the organic light-emitting material and the inorganic light-emitting material may include a phosphorescent material or a fluorescent material. Also, each of the organic light-emitting material and the organic photoactive material may include a monomer or a polymer. The active layer 200 may include both an inorganic material and an organic material.

For example, the active layer 200 may include at least one quantum dot. The quantum dot of the active layer 200 may be a colloidal quantum dot formed by using a colloidal solution. The quantum dot may be a nano-size structure formed of an inorganic semiconductor. For example, the quantum dot may include at least one of group II-VI semiconductors including CdSe, CdS, CdTe, and the like, group III-V semiconductors including InP, GaAs, GaP, and the like, group IV semiconductors including Si, Ge, and the like, and group IV-VI semiconductors including PbSe, PbTe, PbS, and the like. Alternatively, the quantum dot may have a core-shell structure. In this case, the quantum dot may have a CdSe/ZnS structure, an InP/ZnS structure, or the like. CdSe and InP are core portions, and ZnS is a shell portion. Alternatively, the quantum dot may have a core-shell structure having multiple shells. In this case, the quantum dot may have a CdSe/CdS/ZnS structure, an InP/ZnS/CdS/ZnS structure, or the like. CdSe and InP are core portions, and CdS and ZnS are shell portions. However, the aforementioned materials of the quantum dot are exemplary and thus various other materials may be used as a material of the quantum dot. Also, if required, a predetermined organic material layer may be formed on a surface of the quantum dot. In a case where the active layer 200 includes the quantum dot, color purity and color stability of the light-emitting device may be improved.

A first charge transport layer, e.g., a hole transport layer (HTL) 150, may be disposed between the anode 100 and the active layer 200. The HTL 150 may include a p-type inorganic semiconductor and/or a p-type organic semiconductor. Here, the p-type inorganic semiconductor may be oxide or non-oxide, and the p-type organic semiconductor may be a monomer or a polymer. For example, the p-type inorganic semiconductor may be a p-type oxide semiconductor such as $MoO_3$, $NiO$, $V_2O_5$, $Rh_2O_3$, or the like, or may be a p-type non-oxide semiconductor such as p-GaN or the like. The p-type organic semiconductor may include a monomer-based organic material such as NPD, TPD, or the like, or may include a polymer-based organic material such as TFB, PFB, F8T2, or the like. Compounds of NPD, TPD, TFB, PFB, and F8T2 are described below:

NPD: N,N'-diphenyl-N,N'-bis(1-naphthyl)-1,1' biphenyl-4,4-diamine;

TPD: N,N'-bis(3-methyphenyl)-N,N'-diphenylbenzidine;

TFB: poly(9,9-dioctylfluorene-co-N-(4-butylphenyl) diphenylamine);

PFB: poly(9,9-dioctylfluorene-co-bis-N,N-phenyl-1,4-phenylenediamine); and

F8T2: poly(9,9-dioctylfluorene-co-bithiophene).

However, the aforementioned materials of the HTL 150 are exemplary and thus various other materials may be used as a material of the HTL 150. The HTL 150 may be formed by using a sol-gel method, a spray coating method, a spin coating method, a blade coating method, a printing method, a deposition method, or the like.

A second charge transport layer, e.g., an electron transport layer (ETL) 250, may be disposed between the active layer 200 and the cathode 300. The ETL 250 may include an n-type inorganic semiconductor and/or an n-type organic semiconductor. The n-type inorganic semiconductor may be oxide or non-oxide, and the n-type organic semiconductor may be a monomer or a polymer. For example, the n-type inorganic semiconductor may be an n-type oxide semiconductor such as $TiO_2$, $ZnO$, $ZrO_2$ or the like, or may be an n-type non-oxide semiconductor such as n-GaN or the like. The n-type organic semiconductor may include a monomer-based organic material such as Alq3, TAZ, TPBi, BPhen or the like, or may include a polymer-based organic material such as F8BT. Compounds of Alq3, TAZ, TPBi, BPhen, and F8BT are described below:

Alq3: tris-(8-hydroxyquinilone)aluminum;

TAZ: 3-(4-biphenyl)-4-phenyl-5-(4-tert-butylphenyl)-1,2,4-triazole;

TPBi: 2,2,2-(1,3,5-benzinetriyl)-tris(1-phenyl-1-H-benzimidazole);

BPhen: 4,7-diphenyl-1,10-phenanthroline; and

F8BT: poly(9,9-dioctylfluorene-co-benzothiadiazole).

However, the aforementioned materials of the ETL 250 are exemplary and thus various other materials may be used as a material of the ETL 250. Similar to the case of the HTL 150, the ETL 250 may be formed by using a sol-gel method, a spray coating method, a spin coating method, a blade coating method, a printing method, a deposition method, or the like.

A dipole layer may be disposed between the HTL 150 and the active layer 200 and/or between the ETL 250 and the active layer 200. FIG. 1 illustrates a case in which a dipole layer 10 is disposed between the HTL 150 and the active layer 200. The dipole layer 10 may be a layer that forms a dipole moment between the HTL 150 and the active layer 200. The dipole moment may be an electric dipole moment. Also, the dipole moment may be a permanent dipole moment. One surface (a top surface or a bottom surface) of the dipole layer 10 may be a surface (a positive-charge surface) having positive charges, and the other surface of the dipole layer 10 may be a surface (a negative-charge surface) having negative charges. Due to the dipole layer 10, a potential barrier between the HTL 150 and the active layer 200 may be decreased. The potential barrier may be with respect to holes. Due to the dipole layer 10, an ionization potential difference, that is, an ionization energy difference between the HTL 150 and the active layer 200 may be decreased, so that the potential barrier between the HTL 150 and the active layer 200 may be decreased. As ionization potential of the HTL 150 is changed (e.g., an increase) due to the dipole layer 10, the ionization potential difference between the HTL 150 and the active layer 200 may be decreased. As described above, when the potential barrier between the HTL 150 and the active layer 200 is decreased due to the dipole layer 10, holes may easily move between the HTL 150 and the active layer 200. In other words, an energy band level of the HTL 150 and/or the active layer 200 may be changed due to the dipole layer 10, so that an ohmic contact characteristic between the HTL 150 and the active layer 200 may be improved. If the optoelectronic device according to the present embodiment is a light-emitting device, a hole injection characteristic/efficiency from the HTL 150 to the active layer 200 may be improved due to the dipole layer 10. If the optoelectronic device according to the present embodiment is a photovoltaic device, a hole extraction characteristic/efficiency from the active layer 200 to the HTL 150 may be improved due to the dipole layer 10.

In a case where the active layer 200 includes the quantum dot, if the dipole layer 10 is not used, the potential barrier between the HTL 150 and the active layer 200 may be relatively large. This is because a value of ionization potential of the active layer 200 including the quantum dot may be significantly great. Also, in a case where the HTL 150 is formed as an oxide layer, the potential barrier between the HTL 150 and the active layer 200 may be great. Thus, in a case where the dipole layer 10 is not used, movement (injection or extraction) of holes between the HTL 150 and the active layer 200 may not be easy so that an energy conversion efficiency may be decreased. However, as in the present embodiment, if the dipole layer 10 is used, the potential barrier between the HTL 150 and the active layer 200 is decreased so that movement (injection or extraction) of holes between the HTL 150 and the active layer 200 becomes easy so that an energy conversion efficiency of the optoelectronic device may be increased.

The dipole layer 10 may include an amphiphilic material. The amphiphilic material may include a polar portion and a non-polar portion. In this case, one end of the amphiphilic material may be the polar portion, and the other end of the amphiphilic material may be the non-polar portion. The polar portion may correspond to the one surface (top surface or bottom surface) of the dipole layer 10, and the non-polar portion may correspond to the other surface (bottom surface or top surface) of the dipole layer 10. The amphiphilic material may have two different functional groups. For example, the amphiphilic material may have a polar functional group and a non-polar functional group. Alternatively, the amphiphilic material may have a hydrophilic functional group and a hydrophobic functional group. The polar functional group (or the hydrophilic functional group) may be disposed on the one surface (top surface or bottom surface) of the dipole layer 10, and the non-polar functional group (or the hydrophobic functional group) may be disposed on the other surface (bottom surface or top surface) of the dipole layer 10. Due to the dipole layer 10, the dipole moment may be formed.

For example, the dipole layer 10 may include a self-assembled monolayer (SAM) that includes the amphiphilic material. The SAM may include a silane-based material. In this case, the material of the SAM may include aminopropyltriethoxysilane, chloropropyltriethoxysilane, mercaptopropyltriethoxysilane, trichloro(3,3,3,-trifluoropropylsilane), N-propyltriethoxysilane, or the like. The aminopropyltriethoxysilane may include an $NH_2$ functional group, the chloropropyltriethoxysilane may include a Cl functional group, the mercaptopropyltriethoxysilane may include an SH functional group, the trichloro(3,3,3,-trifluoropropylsilane) may include a $CF_3$ functional group, and the N-propyltriethoxysilane may include a $CH_3$ functional group. The aforementioned materials of the SAM and their functional groups are summarized in Table 1.

TABLE 1

| Examples of SAM materials | Functional Groups |
|---|---|
| aminopropyltriethoxysilane | $NH_2$ |
| chloropropyltriethoxysilane | Cl |
| mercaptopropyltriethoxysilane | SH |
| trichloro(3,3,3,-trifluoropropylsilane) | $CF_3$ |
| N-propyltriethoxysilane | $CH_3$ |

The functional groups of the materials of the SAM may be a tail group of each of the materials. Each of the materials in Table 1 may have a head group formed by combining silicon (Si) and three oxygen (O) atoms. The tail group (functional group) and the head group in each of the materials may have different polarities. For example, the head group may have a polarity (hydrophilicity), and the tail group (functional group) may have a non-polarity (hydrophobicity). However, the polarities of the head group and the tail group are exemplary and thus may be changed. Also, the aforementioned materials of the SAM are exemplary and thus various other materials may be used. According to the types of functional groups of the SAM, polarity directions and intensities of a dipole moment formed thereby may vary.

Figure 10:
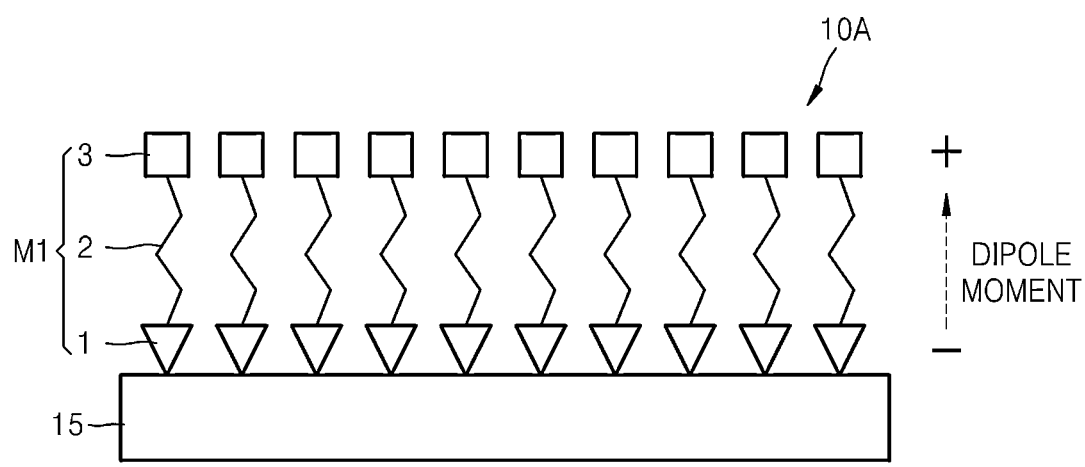
FIG. 10 is a diagram illustrating a self-assembled monolayer (SAM) that may be used in an optoelectronic device, and a dipole moment that is formed due to the SAM, according to an exemplary embodiment.

FIG. 10 is a diagram illustrating an SAM 10A that may be used as the dipole layer 10 of FIG. 1, and a dipole moment that is formed due to the SAM 10A. Referring to FIG. 10, the SAM 10A may have a single-layer structure in which a plurality of molecules M1 are aligned. Each of the molecules M1 may include a head portion 1, a tail portion 3, and a connection portion (a chain portion) 2 that connects the head portion 1 and the tail portion 3. The head portion 1 may be disposed to contact a surface of a lower layer 15, and the tail portion 3 may be disposed on an opposite side, that is, a top portion of the SAM 10A. Since polarities of the head portion 1 and the tail portion 3 are different, a dipole moment may be formed between the head portion 1 and the tail portion 3. However, directions of the dipole moment in FIG. 10 are exemplary and thus may be changed.

Referring back to FIG. 1, the dipole layer 10 disposed between the HTL 150 and the active layer 200 may include a surfactant as the amphiphilic material. Since the surfactant has a hydrophilic functional group and a hydrophobic functional group, the surfactant may be used to form a dipole moment by being used as a material of the dipole layer 10. For example, the surfactant may be a polyethylene glycol (PEG)-based surfactant but is not limited thereto and thus one of various other surfactants may be used as the material of the dipole layer 10.

The SAM and the surfactant may be organic materials. However, in the present embodiment, a material of the dipole layer 10 is not limited to an organic material. In other words, the dipole layer 10 may be formed of an inorganic material. In this case, the inorganic material may include LiF, BaF, $Cs_2CO_3$ or the like. In another embodiment, the dipole layer 10 may be a mixture layer of an organic material and an inorganic material.

A thickness of the dipole layer 10 may be equal to or less than about 10 nm, more particularly, equal to or less than about 5 nm. If the thickness of the dipole layer 10 is small, tunneling of charges via the dipole layer 10 may be made easier. In the case of the HTL 150 and the ETL 250, a thickness of each of the HTL 150 and the ETL 250 may be greater than several tens of nanometers. For example, a thickness of the HTL 150 and/or the ETL 250 may be about 40 nm. When the HTL 150 and the ETL 250 have an appropriate thickness, they may function as an optical spacer and may prevent quenching, that is, a phenomenon in which excitons or charges undesirably move toward an electrode (anode or cathode). However, the aforementioned thicknesses of the dipole layer 10, the HTL 150, and the ETL 250 are merely exemplary and thus may be changed.

Figure 2:
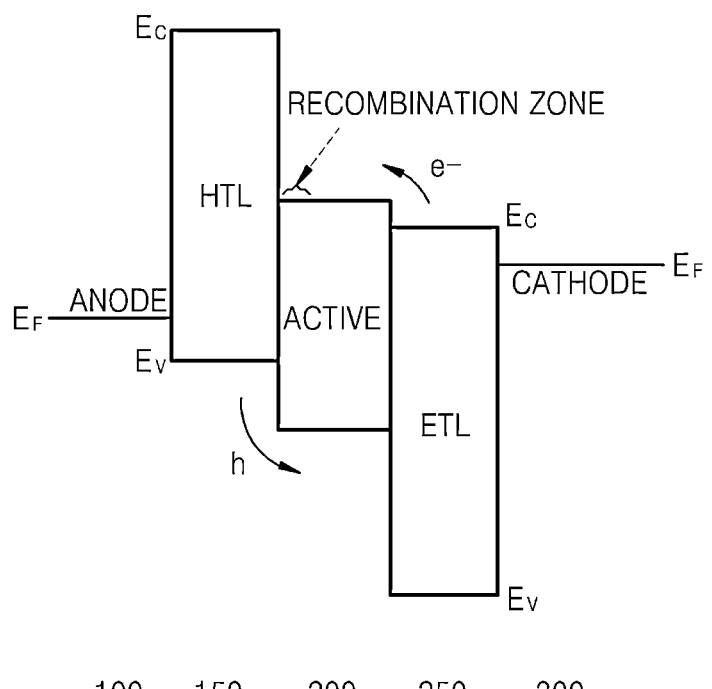
FIG. 2 illustrates an energy band diagram of an optoelectronic device without a dipole layer according to a comparative example.
Figure 3:
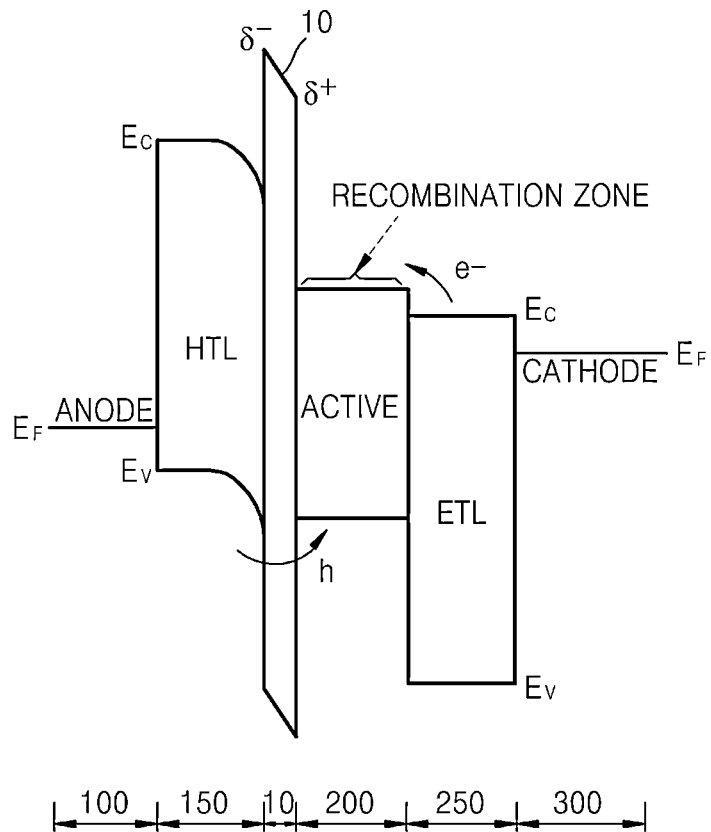
FIG. 3 illustrates an energy band diagram of the optoelectronic device in which a dipole layer is used according to an exemplary embodiment.

FIGS. 2 and 3 are energy band diagrams that respectively illustrate a case (a comparative example) in which a dipole layer is not used, and a case (the present embodiment) in which a dipole layer is used. That is, FIG. 2 is the energy band diagram illustrating a structure of FIG. 1 in which the dipole layer 10 is excluded, and FIG. 3 is the energy band diagram illustrating a structure of FIG. 1 in which the dipole layer 10 is included. Reference numerals $E_C$ and $E_V$ respectively indicate a lowest energy level in a conduction band and an uppermost energy level in a valence band. Reference numerals e- and h indicate an electron and a hole, respectively. Also, FIGS. 2 and 3 illustrate a Fermi energy level $E_F$ of each of the anode 100 and the cathode 300. These reference numerals are the same in FIGS. 5 and 6. Also, descriptions in reference to FIGS. 2 and 3 correspond to a case in which the optoelectronic device is a light-emitting device.

Referring to FIG. 2, in the optoelectronic device without the dipole layer 10 according to the comparative example, a difference between $E_V$ of the HTL 150 and $E_V$ of the active layer 200 is large and thus, hole injection from the HTL 150 to the active layer 200 may not be easy. In particular, in a case where the active layer 200 includes the quantum dot, $E_V$ of the active layer 200 is very low, that is, ionization potential of the active layer 200 is very large, and thus, the hole injection to the active layer 200 may not be easy. Thus, a width of a zone in the active layer 200 in which electrons and holes are combined, that is, the width of a recombination zone may be very small resulting in an energy conversion efficiency being small.

However, if the dipole layer 10 is used as in the case of FIG. 3, a potential barrier between the HTL 150 and the active layer 200 is decreased due to the dipole layer 10, so that movement of holes between the HTL 150 and the active layer 200 may be made easier. As $E_V$ of the HTL 150 is decreased due to the dipole layer 10, the potential barrier between the HTL 150 and the active layer 200 may be decreased. Thus, holes may be easily injected from the HTL 150 to the active layer 200, and the width of the recombination zone may be increased, so that an energy conversion efficiency may be improved. However, the energy band of FIG. 3 is exemplary and thus a structure of an energy band may vary according to materials that are used therein.

According to another embodiment, a dipole layer may be further disposed between the active layer 200 and the ETL 250 in FIG. 1. This embodiment is illustrated in FIG. 4.

Figure 4:
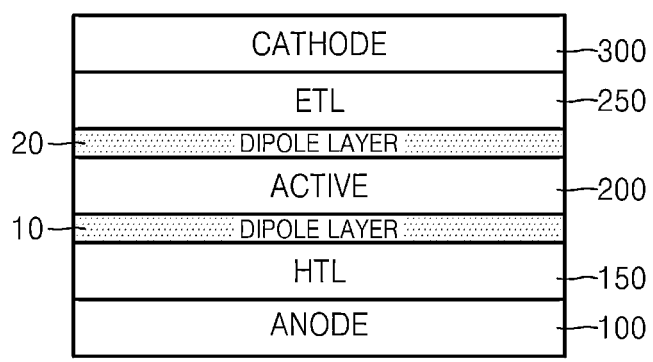
FIG. 4 is a cross-sectional view illustrating an optoelectronic device according to another exemplary embodiment.

Referring to FIG. 4, a dipole layer 20 may be disposed between the active layer 200 and the ETL 250. Hereinafter, the dipole layer 10 that is disposed between the HTL 150 and the active layer 200 is referred to as a first dipole layer 10, and the dipole layer 20 that is disposed between the active layer 200 and the ETL 250 is referred to as a second dipole layer 20. The second dipole layer 20 may function to decrease a potential barrier between the active layer 200 and the ETL 250. Here, the potential barrier may be with respect to electrons. Thus, movement of electrons between the active layer 200 and the ETL 250 may be made easier due to the second dipole layer 20. The second dipole layer 20 may be formed of the same material or a similar material as that of the first dipole layer 10. For example, the second dipole layer 20 may be formed of organic materials such as an SAM and a surfactant or may be formed of an inorganic material. Examples of the SAM, the surfactant, and the inorganic material may be the same as described with reference to FIG. 1. Although the second dipole layer 20 is formed of the same or similar material as the first dipole layer 10, a function/effect of the second dipole layer 20 with respect to the ETL 250, and a function/effect of the first dipole layer 10 with respect to the HTL 150 may be different from each other. In another embodiment, the second dipole layer 20 may be formed of a different material from the first dipole layer 10.

Figure 5:
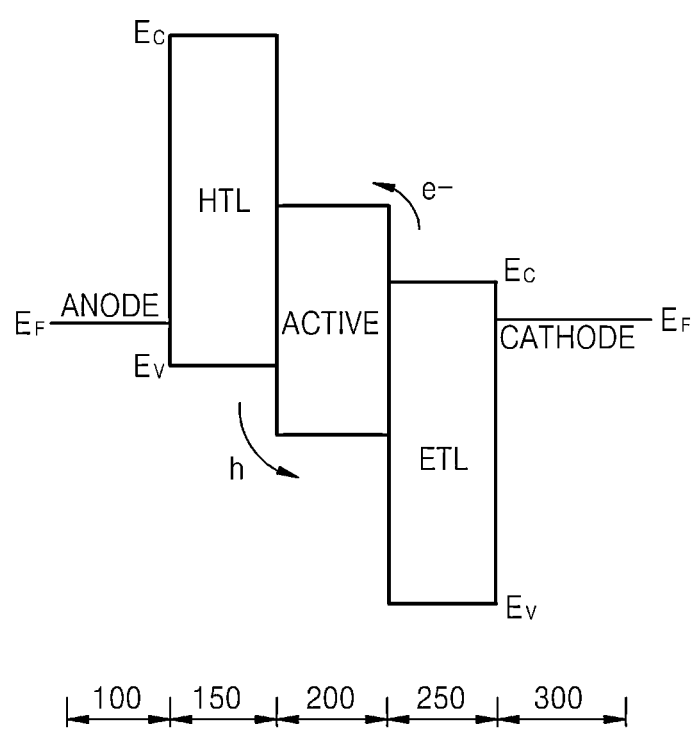
FIG. 5 illustrates an energy band diagram of an optoelectronic device without a dipole layer according to another comparative example.
Figure 6:
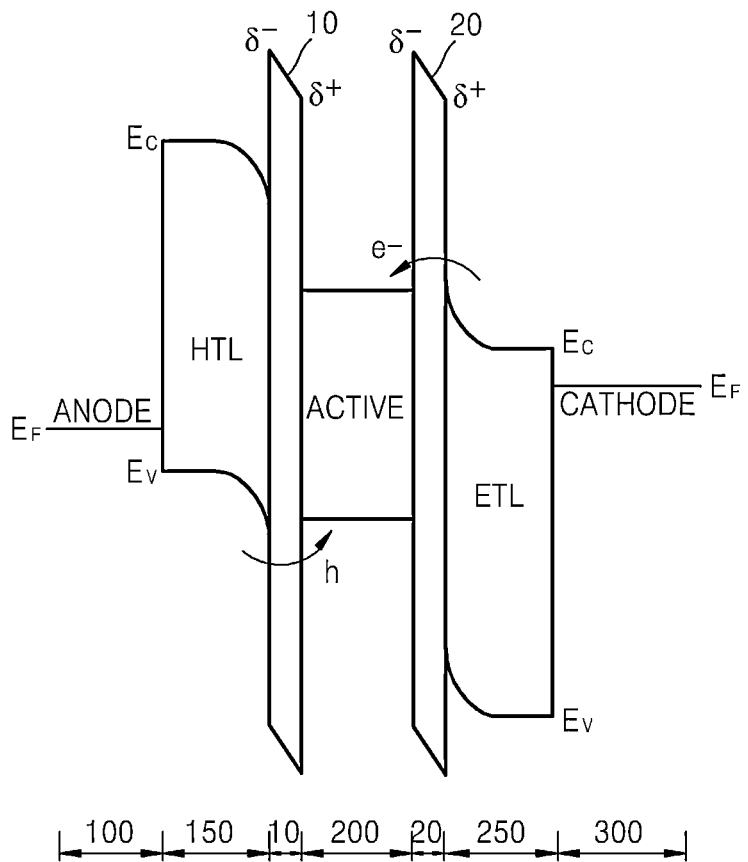
FIG. 6 illustrates an energy band diagram of an optoelectronic device in which two dipole layers are used according to another exemplary embodiment.

FIGS. 5 and 6 are energy band diagrams that respectively illustrate a case (a comparative example) in which a dipole layer is not used, and a case (the present embodiment) in which a dipole layer is used. That is, FIG. 5 is the energy band diagram illustrating the structure of FIG. 4 in which the first and second dipole layers 10 and 20 are excluded, and FIG. 6 is the energy band diagram illustrating the structure of FIG. 4 in which the first and second dipole layers 10 and 20 are included. Also, descriptions with reference to FIGS. 5 and 6 correspond to a case in which the optoelectronic device is a light-emitting device.

Referring to FIG. 5, similar to the case of FIG. 2, a difference between $E_V$ of the HTL 150 and $E_V$ of the active layer 200 is large and thus, hole injection from the HTL 150 to the active layer 200 may not be easy. Also, a difference between $E_C$ of the ETL 250 and $E_C$ of the active layer 200 is large and thus, electron injection from the ETL 250 to the active layer 200 may not be easy. In the case of FIG. 2, a difference between $E_C$ of the ETL 250 and $E_C$ of the active layer 200 is not large and thus, electron injection from the ETL 250 to the active layer 200 may be easy, but this is not the case of FIG. 5.

Referring to FIG. 6, if the first and second dipole layers 10 and 20 are used, a potential barrier with respect to holes between the HTL 150 and the active layer 200 may be decreased due to the first dipole layer 10, and a potential barrier with respect to electrons between the ETL 250 and the active layer 200 may be decreased due to the second dipole layer 20. Thus, hole injection from the HTL 150 to the active layer 200, and electron injection from the ETL 250 to the active layer 200 may be easy. As a result, an energy conversion efficiency of the optoelectronic device may be improved.

According to another embodiment, various modified examples of the cases of FIGS. 1 and 4 are possible. These various examples are illustrated in FIGS. 7 through 9.

Figure 7:
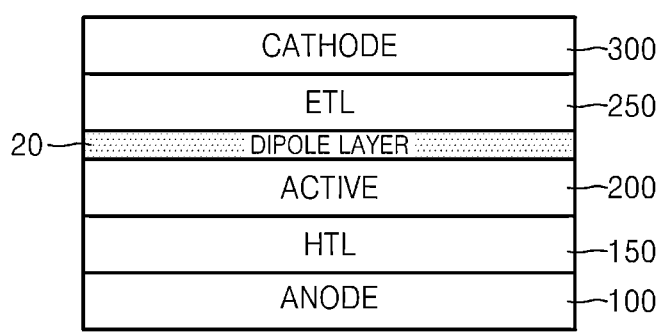
FIGS. 7 through 9 are cross-sectional views illustrating an optoelectronic device according to another exemplary embodiment.

FIG. 7 illustrates a structure in which the first dipole layer 10 is excluded from the structure of FIG. 4. If a potential barrier (a potential barrier with respect to holes) between the HTL 150 and the active layer 200 is small, the structure of FIG. 7 may be possible.

Figure 8:
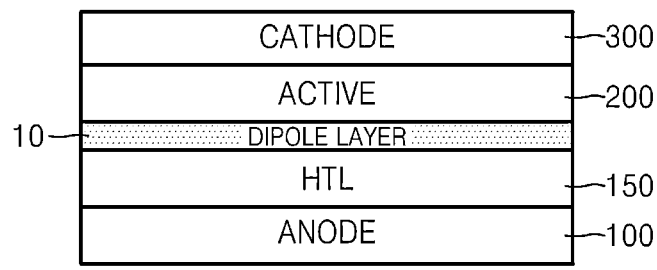

FIG. 8 illustrates a structure in which the ETL 250 is excluded from the structure of FIG. 1. The use of the ETL 250 is optional in the structure of FIG. 1 so that the structure of FIG. 8 may be possible.

Figure 9:
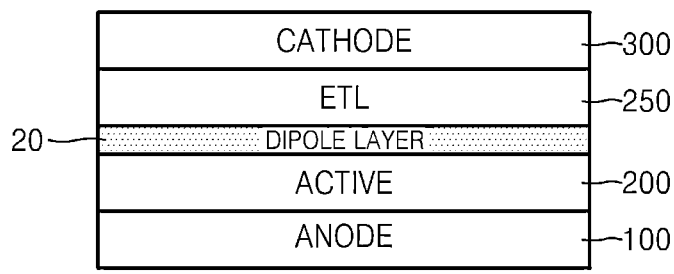

FIG. 9 illustrates a structure in which the HTL 150 is excluded from the structure of FIG. 7. The use of the HTL 150 is optional in the structure of FIG. 7 so that the structure of FIG. 9 may be possible.

Table 2 shows values of surface energy of samples in each of which one of various SAMs is formed on a $MoO_3$ layer. The $MoO_3$ layer is an example of a material layer (an oxide layer) that may be used as the HTL 150 of FIG. 1. Materials that are used for the SAMs are the same in Table 1. In Table 2, $NH_2$, Cl, SH, $CF_3$, and $CH_3$ indicate functional groups of corresponding SAMs, respectively. For example, $NH_2$ corresponds to a case in which aminopropyltriethoxysilane is formed on the $MoO_3$ layer. Referring to Table 1, it is possible to see materials that correspond to the functional groups, respectively. In Table 2, "none" indicates a result of a case in which a SAM is not formed on the $MoO_3$ layer.

TABLE 2

|  | MoO$_3$ | | | | | |
| --- | --- | --- | --- | --- | --- | --- |
|  | None | —NH$_2$ | —Cl | —SH | —CF$_3$ | —CH$_3$ |
| Total surface energy (mN/m) | 49.94 | 30.52 | 34.38 | 31.85 | 32.20 | 27.01 |
| Polar part (mN/m) | 37.20 | 17.17 | 6.10 | 7.41 | 13.30 | 5.47 |
| Non-polar part (mN/m) | 12.74 | 13.35 | 28.28 | 24.44 | 18.90 | 21.54 |

Referring to Table 2, it is possible to see that a polar part is intensive in the MoO$_3$ layer corresponding to a case of "none", that is, the MoO$_3$ layer whereon a SAM is not formed, but a non-polar part is intensive in most cases where SAMs are formed on the MoO$_3$ layer. This means that a state of a surface of the MoO$_3$ layer which was polar may be changed to be non-polar due to the SAM.

Table 3 shows values of surface energy of samples in each of which one of various SAMs is formed on a NiO layer. The NiO layer is an example of a material layer (an oxide layer) that may be used as the HTL 150 of FIG. 1. Materials used for the SAMs are the same as in Table 1.

TABLE 3

|  | NiO | | | | | |
| --- | --- | --- | --- | --- | --- | --- |
|  | None | —NH$_2$ | —Cl | —SH | —CF$_3$ | —CH$_3$ |
| Total surface energy (mN/m) | 59.34 | 42.51 | 46.04 | 78.00 | 69.27 | 47.66 |
| Polar part (mN/m) | 51.70 | 33.61 | 35.20 | 0.94 | 68.08 | 0.36 |
| Non-polar part (mN/m) | 7.66 | 8.90 | 10.84 | 77.06 | 1.20 | 47.30 |

Referring to FIG. 3, it is possible to see that a surface of the NiO layer becomes non-polar when the SAM is formed of mercaptopropyltriethoxysilane having a SH functional group and N-propyltriethoxysilane having a CH3 function group. Meanwhile, in other SAMs, a polar characteristic is maintained.

FIG. 4 shows ionization potential levels of samples when various SAMs are formed on a MoO$_3$ layer. Materials used for the SAMs are the same as in Table 1. In Table 4, NH2, Cl, SH, CF$_3$, and CH$_3$ indicate functional groups of the SAMs, respectively. For example, MoO$_3$—NH$_2$ indicates a case in which aminopropyltriethoxysilane is formed on the MoO$_3$ layer. Materials that respectively correspond to the functional groups are shown in Table 1.

TABLE 4

| Film | Ionization potential level (eV) |
| --- | --- |
| MoO$_3$ | 5.30 |
| MoO$_3$—NH$_2$ | 6.07 |
| MoO$_3$—Cl | 5.94 |
| MoO$_3$—SH | 6.15 |
| MoO$_3$—CF$_3$ | 5.85 |
| MoO$_3$—CH$_3$ | 5.37 |

Referring to Table 4, in a case where the SAM is formed on the MoO$_3$ layer, the ionization potential level is increased, compared to a case in which a SAM is not formed on the MoO$_3$ layer. This means that all of the SAMs in Table 4 have an electron donating characteristic with respect to the MoO$_3$ layer. Thus, all of the SAMs in Table 4 may decrease a band level of the MoO$_3$ layer. In particular, when the SAM of mercaptopropyltriethoxysilane having a SH functional group is formed, that is, in the case of MoO$_3$—SH, the ionization potential level is increased by about 0.85 eV. Also, when the SAM having the rest of the functional groups except for a CH$_3$ functional group is used, the ionization potential level is increased by at least about 0.5 eV. These changes in the ionization potential level mean changes in the energy band level (i.e., band bending).

FIG. 5 shows ionization potential levels of samples when various SAMs are formed on a NiO layer. Materials used for the SAMs are the same as in Table 1. In Table 5, NH$_2$, Cl, SH, CF$_3$, and CH$_3$ indicate functional groups of the SAMs, respectively. For example, NiO-NH$_2$ indicates a case in which aminopropyltriethoxysilane is formed on the NiO layer. Materials that respectively correspond to the functional groups are shown in Table 1.

TABLE 5

| Film | Ionization potential level (eV) |
| --- | --- |
| NiO | 4.66 |
| NiO—NH$_2$ | 4.63 |
| NiO—Cl | 4.64 |
| NiO—SH | 4.90 |
| NiO—CF$_3$ | 4.66 |
| NiO—CH$_3$ | 4.95 |

Referring to Table 5, in a case where the SAM having a SH functional group is formed on the NiO layer, and where the SAM having a CH$_3$ functional group is formed on the NiO layer, the ionization potential level is increased by about 0.3 eV, compared to a case in which a SAM is not formed on the NiO layer. This means that the SAM having the SH functional group, and the SAM having the CH$_3$ functional group have an electron donating characteristic with respect to the NiO layer. Meanwhile, in a case where the SAM having an NH$_2$ functional group is formed on the NiO layer, and the SAM having a Cl functional group is formed on the NiO layer, the ionization potential level is slightly decreased. This means that the SAM having the NH$_2$ functional group, and the SAM having the Cl functional group have a slight electron withdrawing characteristic with respect to the NiO layer.

Figure 11:
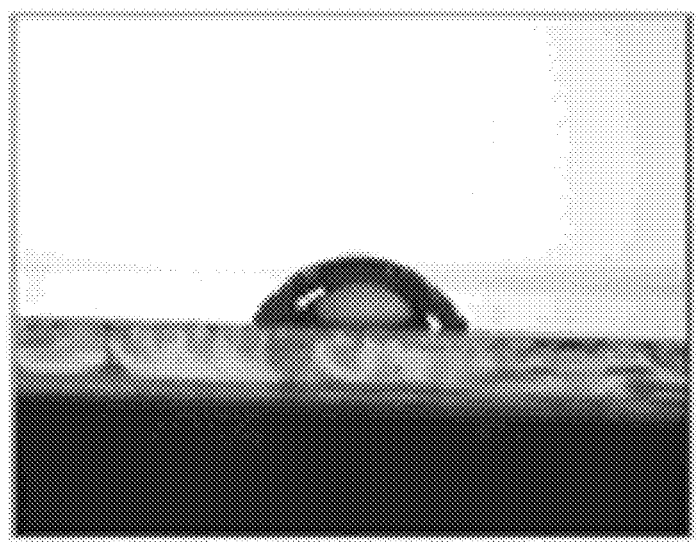
FIGS. 11 and 12 are images illustrating a change in a contact angle of a water drop, before and after a SAM is formed on a $MoO_3$ layer.
Figure 12:
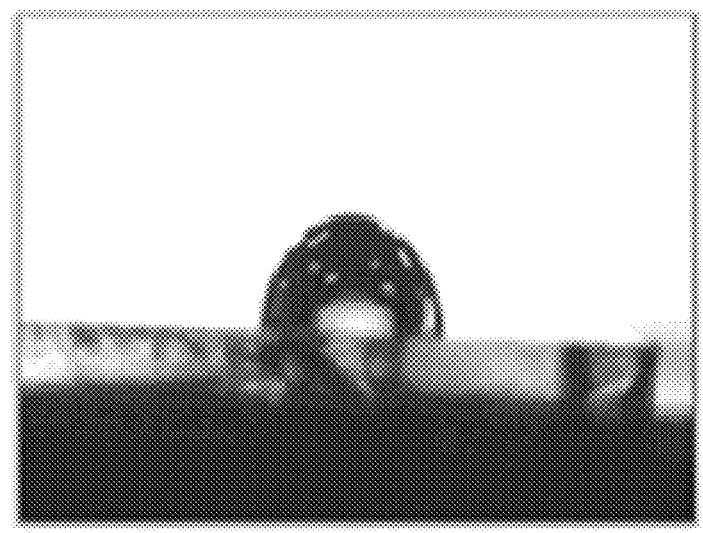

FIGS. 11 and 12 are images illustrating a change in a contact angle of a water drop, before and after a SAM is formed on a MoO$_3$ layer. A material used to form the SAM in FIG. 12 is mercaptopropyltriethoxysilane having an SH functional group.

Referring to the images of FIGS. 11 and 12, the contact angle of the water drop in the case of FIG. 12 in which the SAM is formed is remarkably increased, compared to the case of FIG. 11 in which the SAM is not formed. This means that a surface polarity of the MoO$_3$ layer is changed due to the SAM. In more detail, results shown in FIGS. 11 and 12 mean that a state of a surface of the MoO$_3$ layer is changed from hydrophilicity (polarity) to hydrophobicity (non-polarity) due to the SAM. These results are the same as a result described with reference to Table 2.

Figure 13:
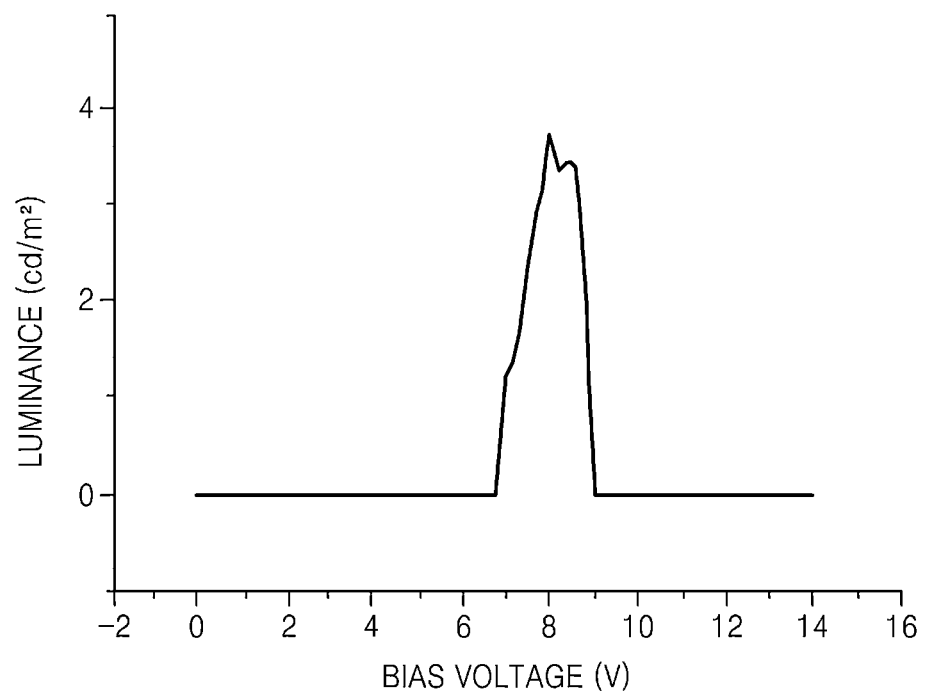
FIG. 13 is a graph illustrating a voltage-luminance characteristic of an optoelectronic device (light-emitting device), according to an exemplary embodiment.

FIG. 13 is a graph illustrating a voltage-luminance characteristic of a light-emitting device, according to an exemplary embodiment. The light-emitting device that was used to obtain a result shown in the graph of FIG. 13 has the structure of FIG. 1. The anode 100 is formed as an ITO layer, the HTL 150 is formed as a MoO$_3$ layer, the ETL 250 is formed as a TiO$_2$ layer, and the cathode 300 is formed as an Al layer. The active layer 200 is a light-emitting layer including a quantum dot, and the dipole layer 10 is formed as a SAM formed of mercaptopropyltriethoxysilane having an SH functional group.

Referring to FIG. 13, it is possible to see that there is a high luminance (brightness) of about 4 cd/m² when about 8V is applied between the anode 100 and the cathode 300.

Figure 14:
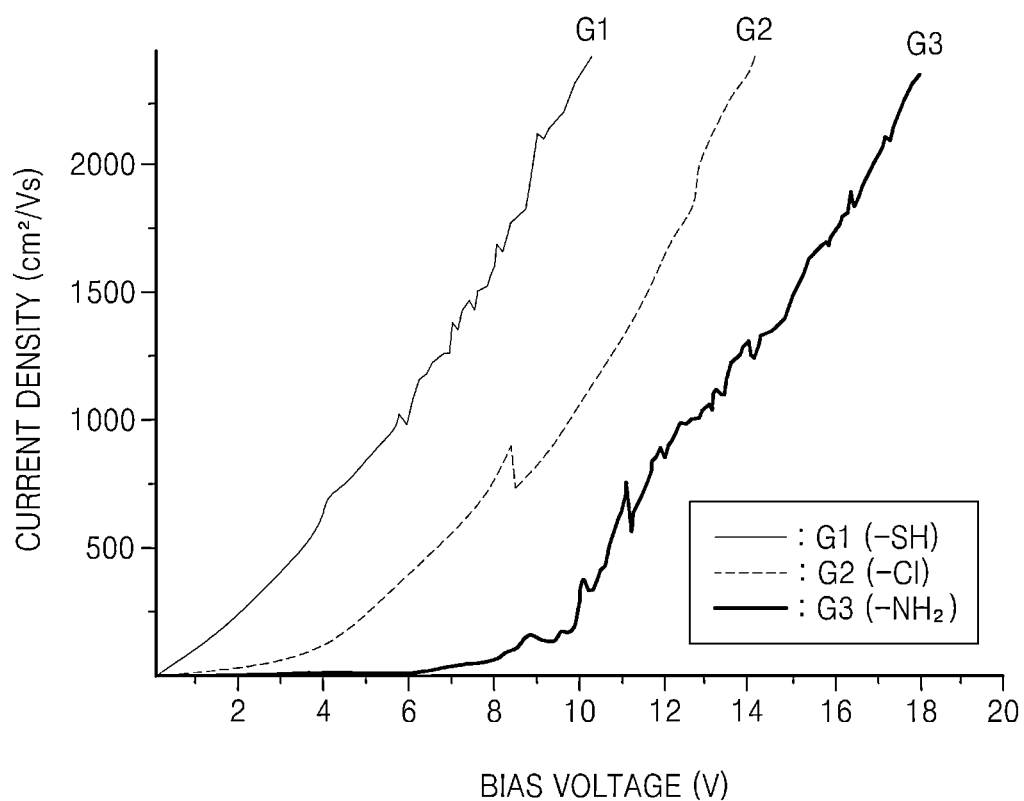
FIG. 14 illustrates graphs, each showing a voltage-current characteristic of an optoelectronic device (light-emitting device), according to an exemplary embodiment.

FIG. 14 illustrates first through third graphs G1 through G3, each showing a voltage-current characteristic of a light-emitting device, according to an embodiment of the present invention. Each of the first through third graphs G1 through G3 of FIG. 14 is with respect to the light-emitting device having the structure shown in FIG. 1. However, materials that were used to form the dipole layers 10 in the first through third graphs G1 through G3 are different. The first graph G1 is with respect to the light-emitting device in which a SAM formed of mercaptopropyltriethoxysilane having an SH functional group is formed as the dipole layers 10, the second graph G2 is with respect to the light-emitting device in which a SAM formed of chloropropyltriethoxysilane having a Cl functional group is formed as the dipole layers 10, and the third graph G3 is with respect to the light-emitting device in which a SAM formed of aminopropyltriethoxysilane having an $NH_2$ functional group is formed as the dipole layers 10. Here, the HTLs 150 are all $MoO_3$ layers.

Referring to FIG. 14, the first graph G1, the second graph G2, and the third graph G3 are sequentially positioned along a rightward direction. This means that, when the same voltage (e.g., 9V) is applied to each light-emitting device, a current density of the light-emitting device corresponding to the first graph G1 is highest, a current density of the light-emitting device corresponding to the second graph G2 is second-highest, and a current density of the light-emitting device corresponding to the third graph G3 is lowest. The first through third graphs G1 through G3 show that the voltage-current characteristic may vary according to types of a functional group used in the dipole layers 10.

It should be understood that the exemplary embodiments described herein should be considered in a descriptive sense only and not for purposes of limitation. For example, it will be obvious to one of ordinary skill in the art that the structure of the optoelectronic device in FIGS. 1, 4, and 7 through 9 may vary. In more detail, the optoelectronic device according to the above one or more exemplary embodiments may further include an electron blocking layer (EBL) and/or a hole blocking layer (HBL), and other material layers. Also, in the above one or more exemplary embodiments, the dipole layers 10 and 20 may shift an energy band level of a material layer, which is adjacent to the dipole layers 10 and 20, in a positive direction or a negative direction. In addition, it will be obvious to one of ordinary skill in the art that an idea of the one or more of the above exemplary embodiments may be applied to devices other than the optoelectronic device. Thus, the spirit and scope of the present inventive concept will be defined by the following claims.

What is claimed is:

1. An optoelectronic device comprising:
a first electrode;
a second electrode;
an active layer between the first electrode and the second electrode;
a first charge transport layer between the first electrode and the active layer;
a second charge transport layer between the second electrode and the active layer;
a first dipole layer which forms a first dipole moment between the active layer and the first charge transport layer; and
a second dipole layer which forms a second dipole moment between the active layer and the second charge transport layer, wherein one surface of the second dipole layer has a polarity or hydrophilicity, and a second surface of the second dipole layer has a non-polarity or hydrophobicity.

2. The optoelectronic device of claim 1, wherein the first charge transport layer transports a first charge, the second charge transport layer transports a second charge,
wherein a first potential barrier with respect to the first charge between the active layer and the first charge transport layer is lowered by the first dipole moment, and
wherein a second potential barrier with respect to the second charge between the active layer and the second charge transport layer is lowered by the second dipole moment.

3. The optoelectronic device of claim 1, wherein at least one of the first dipole layer and the second dipole layer comprise an amphiphilic material.

4. The optoelectronic device of claim 3, wherein the amphiphilic material comprises a polar portion and a nonpolar portion.

5. The optoelectronic device of claim 3, wherein the amphiphilic material comprises a hydrophilic functional group and a hydrophobic functional group.

6. The optoelectronic device of claim 1, wherein at least one of the first dipole layer and the second dipole layer comprise a self-assembled monolayer (SAM).

7. The optoelectronic device of claim 1, wherein at least one of the first dipole layer and the second dipole layer comprise a surfactant.

8. The optoelectronic device of claim 1, wherein at least one of the first dipole layer and the second dipole layer comprise an inorganic material.

9. The optoelectronic device of claim 1, wherein a thickness of at least one of the first dipole layer and the second dipole layer is equal to or less than about 10 nm.

10. The optoelectronic device of claim 1, wherein the first charge transport layer is a hole transport layer (HTL) and the second charge transport layer is an electron transport layer (ETL).

11. The optoelectronic device of claim 10, wherein:
the HTL comprises at least one of a p-type inorganic semiconductor and a p-type organic semiconductor,
the p-type inorganic semiconductor is oxide or non-oxide, and
the p-type organic semiconductor is a monomer or a polymer, the ETL comprises at least one of an n-type inorganic semiconductor and an n-type organic semiconductor,
the n-type inorganic semiconductor is oxide or non-oxide, and
the n-type organic semiconductor is a monomer or a polymer.

12. The optoelectronic device of claim 10, wherein the first dipole layer decreases an ionization potential of the HTL between the active layer and the first charge transport layer, and
the second dipole layer decreases an ionization potential of the ETL between the active layer and the second charge transport layer.

13. The optoelectronic device of claim 1, wherein the active layer comprises a quantum dot.

14. The optoelectronic device of claim 1, wherein the active layer comprises at least one of an inorganic material and an organic material.

15. The optoelectronic device of claim 1, wherein the active layer is a light-emitting layer, and
the optoelectronic device is a light-emitting device.

16. The optoelectronic device of claim 1, wherein the active layer is a photoactive layer, and
the optoelectronic device is a photovoltaic device.

* * * * *